(12) United States Patent
Laret et al.

(10) Patent No.: US 7,347,514 B2
(45) Date of Patent: Mar. 25, 2008

(54) DEVICE FOR LOCK-FIXING AN APPARATUS DESIGNED TO BE MOUNTED IN A RACK

(75) Inventors: Daniel Laret, St Medard en Jalles (FR); Laurent Salanqueda, Bordeaux (FR)

(73) Assignee: Thales (FR)

( * ) Notice: Subject to any disclaimer, the term of this patent is extended or adjusted under 35 U.S.C. 154(b) by 315 days.

(21) Appl. No.: 10/532,065

(22) PCT Filed: Oct. 10, 2003

(86) PCT No.: PCT/FR03/03000

§ 371 (c)(1), (2), (4) Date: Apr. 20, 2005

(87) PCT Pub. No.: WO2004/040951

PCT Pub. Date: May 13, 2004

(65) Prior Publication Data

US 2006/0163982 A1  Jul. 27, 2006

(30) Foreign Application Priority Data

Oct. 25, 2002  (FR) .................................. 02 13413

(51) Int. Cl.
*A47B 95/02* (2006.01)
(52) U.S. Cl. .................................. 312/332.1
(58) Field of Classification Search ............ 312/330.1, 312/332.1, 223.1, 223.2, 333; 211/26; 361/685, 361/724, 725, 726, 727; 439/157
See application file for complete search history.

(56) References Cited

U.S. PATENT DOCUMENTS

| | | | | |
|---|---|---|---|---|
| 3,039,837 A * | 6/1962 | Poe | ......................... | 312/332.1 |
| 3,120,412 A * | 2/1964 | Caldwell | .................. | 312/332.1 |
| 3,521,939 A * | 7/1970 | Vaughn et al. | ........... | 312/332.1 |
| 4,991,818 A * | 2/1991 | Darbo et al. | ................. | 248/681 |
| 5,765,933 A * | 6/1998 | Paul et al. | ................ | 312/332.1 |
| 5,791,753 A * | 8/1998 | Paquin | .................... | 312/332.1 |

FOREIGN PATENT DOCUMENTS

| | | |
|---|---|---|
| FR | 2625829 A | 7/1989 |
| FR | 2787282 A | 6/2000 |
| GB | 2015828 A | 9/1979 |
| WO | WO 00/36885 * | 6/2000 |

* cited by examiner

*Primary Examiner*—James O. Hansen
(74) *Attorney, Agent, or Firm*—Lowe Hauptman Ham & Berner, LLP

(57) ABSTRACT

The present invention relates to a lock-fixing device of an apparatus designed to be mounted in a rack, and relates in particular to the fixing of radio electric or electronic apparatus, with the aid of a fixing of the "lock" type. The fixing device applies in a particularly advantageous manner to a so-called "onboard" apparatus. The fixing device includes first and second fixing elements secured respectively to the apparatus and the rack. The first element is moved by the operation of a handle in order to interact with the other element to fix the apparatus in the rack. The fixing device includes a mechanism for locking the handle. According to the invention, the handle (14) has a gripping member connected to a handle body situated on one side of the apparatus. The locking mechanism has a sliding hook serving as an abutment to the handle body in the locked position.

18 Claims, 3 Drawing Sheets

DEVICE FOR LOCK-FIXING AN APPARATUS DESIGNED TO BE MOUNTED IN A RACK

CROSS-REFERENCE TO RELATED APPLICATIONS

The present Application is based on International Application No. PCT/FR2003/003000, filed on Oct. 10, 2003, which in turn corresponds to FR 02/13413 filed on Oct. 25, 2002, and priority is hereby claimed under 35 USC §119 based on these applications. Each of these applications are hereby incorporated by reference in their entirety into the present application.

FIELD OF THE INVENTION

The present invention relates to a device for lock-fixing an apparatus mounted in a rack, and relates particularly to the fixing of radio electric or electronic apparatus, with the aid of a "lock" type fixing. It applies in a particularly advantageous manner to so-called "onboard" apparatus, mounted for example in aircraft, tanks etc.

DESCRIPTION OF THE PRIOR ART

Racks are chassis in which the items of apparatus may be placed either alone, or side by side and/or superposed during their operation. The rear of each of these items of apparatus usually comprises one or more connectors, electric or other, which correspond to connectors placed in the back of a space allocated to each apparatus in the rack. These connectors mounted in the rack are linked, at the rear of the latter, to one another or to other items of equipment; the insertion of an apparatus into the space allocated thereto has the effect of establishing the connections necessary for its operation, for example electric connections.

The value of placing items of apparatus in racks lies particularly in the speed and ease of their installation. It is therefore advantageous to keep these items of apparatus fixed in their operating position in the racks, with the aid of so-called "lock" systems which are simple and quick to operate, both for installing these items of apparatus in the rack and for extracting them from this rack. The operating position constitutes a position, called locked, and the extraction of an apparatus is obtained by an unlocking operation.

It is thus possible very quickly either simply to add an apparatus useful to the operation, or to work on an apparatus to repair it or to replace it with another having other features, which justifies the use of a rack system even for a single apparatus.

Items of apparatus are found placed in racks in many fields of activity such as laboratories, industrial sites, control rooms, etc., fields in which the lock-fixing devices are of routine use and give overall satisfaction.

But in other cases, particularly those in which the racks are "onboard", that is to say mounted for example onboard planes, or tanks or helicopters, the use of these conventional lock-fixing devices poses many problems. In the case for example of an aircraft, the operating conditions of the onboard materials are particularly difficult. The items of apparatus may be subjected in particular to vibrations and/or considerable accelerations and decelerations, which require the reinforcement of the means used to fix them.

In French patent application FR 2 787 282, the applicant has described a lock-fixing device for an apparatus mounted in a rack which makes it possible to fix an apparatus quickly and securely, to extract it easily, and which is furthermore applicable to items of apparatus mounted in aircraft and, more generally, to onboard items of apparatus, for which the fixing conditions are subjected to severe stresses.

For this, the device described in the aforementioned application comprises a first and a second fixing element secured respectively to the apparatus and the rack, the first element being moved by operating a handle in order to interact with the other element to fix the apparatus in the rack. It comprises furthermore a mechanism for locking the handle acting at the outside of the rack on said handle and formed according to an example of a leaf spring mounted between the front face of the apparatus and a frame rimming said front face on its four sides, the leaf spring being positioned so as to hold the handle to immobilize it when the latter is brought into its locked position.

This particularly effective system however has the drawback of reducing the effective zone of vision on the front face due to the presence of protruding parts (leaf spring), which is particularly awkward notably in the case of an apparatus of the display type for which an attempt is always being made to obtain a maximal effective field of vision for minimal dimensions of the rack, particularly in the case in which this apparatus is intended to be installed onboard.

The present invention makes it possible to remedy this drawback by proposing a lock-fixing system in which the locking mechanism acts on the side blank element of the handle, thus making it possible to have no projecting parts on the front face.

SUMMARY OF THE INVENTION

More precisely, the invention proposes a lock-fixing device of an apparatus designed to be mounted in a rack comprising first and second fixing elements respectively secured to the apparatus and the rack, the first element being moved by operating a handle in order to interact with the other element to fix the apparatus in the rack, a mechanism for locking said handle, the device being characterized in that the handle has a gripping member connected to a handle body situated on a side of the apparatus and in that the locking mechanism comprises a sliding hook serving as an abutment to said handle body in the locked position.

The fixing device according to the invention also allows, thanks to the sliding hook, an unlocking of the handle on the front face, thus not requiring the introduction of an additional space on the sides of the apparatus to carry out the unlocking, and thereby allowing the size of the front face of the apparatus to be optimized relative to the lateral space requirement of the rack.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description thereof are to be regarded as illustrative in nature, and not as restrictive.

BRIEF DESCRIPTION OF THE DRAWINGS

Other advantages and features will appear more clearly on reading the following description, illustrated by the appended figures which represent.

DETAILED DESCRIPTION OF THE INVENTION

In these figures, identical elements are given the same reference numbers.

Figure 1:
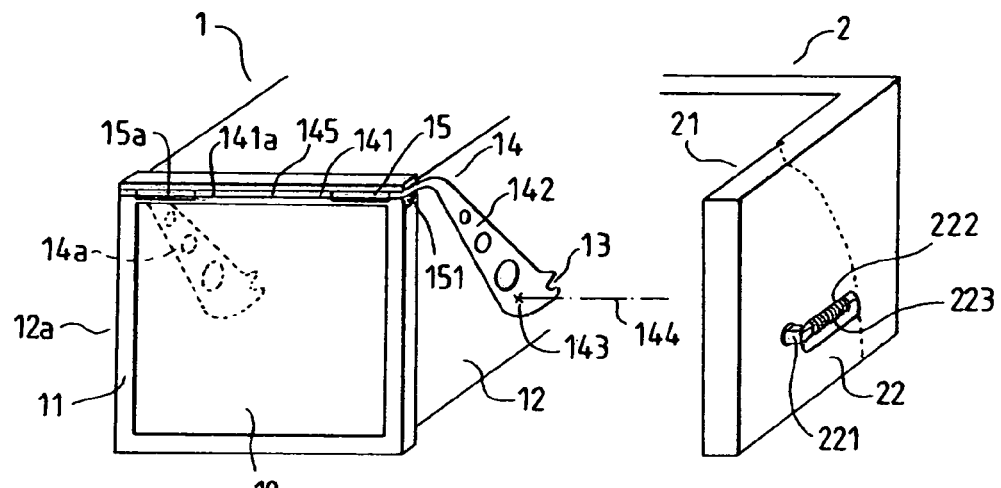
FIG. 1, a diagram of a fixing device according to the invention.

FIG. 1 represents a simplified diagram of an apparatus 1, designed to be fixed in a rack or chassis 2. For purposes of clarity, the apparatus and the rack are represented in exploded manner. The apparatus 1 is for example a display apparatus with a front face 10 formed in this example of a screen and generally rimmed on its four sides with rigid frame (or surround) 11, allowing handling of the object without acting on the glass of the screen. Front face means the face that can be seen by a user once the apparatus is fixed in the rack, as opposed to the rear face which bears the connector (not shown). The sides 12 of the apparatus are inserted along the side walls 21 of the rack 2. The rack is designed to receive one or more items of apparatus, arranged side by side and/or one above the other. In the case of onboard items of apparatus, the external dimensions in width as in height of the rack are usually fixed by the pressures of space requirement. The problem is then to find a secure fixing device which also makes it possible to maximize the effective zone of the front face, that is to say the size of the screen that can be seen by the user in the case of a display apparatus.

The fixing device according to the invention satisfies this dual requirement. For this it comprises on the one hand a first fixing element 13 secured to the apparatus 1 and a second fixing element 22 secured to the rack 2, the first element being moved by operating a handle 14 in order to interact with the other element to fix the apparatus in the rack, and on the other hand a mechanism 15 for locking the handle. According to the invention, the handle has a gripping member 141 connected to a handle body 142 situated on one side of the apparatus 12. The locking mechanism 15 comprises a sliding hook 151 serving as an abutment to said handle body 142 in the locked position. The locking mechanism 15 of the fixing device according to the invention, thanks to the use of the hook which abuts the handle body which forms the side blank element of the handle, makes it possible to maximize the effective zone of the front face, because no part projecting on the front face is necessary for the operation of the locking mechanism. In addition, unlocking can be carried out by actuating the sliding hook on the front face, thus avoiding unlocking by actuating the locking mechanism on the sides of the device, which would require the provision of space on the sides of the apparatus and would therefore reduce the effective zone on the front face of the apparatus.

In the nonlimiting example of FIG. 1, the handle body 142 is secured to the side of the apparatus 12 by means of a pivot 143 rotating about an axis 144. In FIG. 1, the axis 144 is shown horizontal, the handle being operated by the user in a bottom-to-top rotary movement to fix the apparatus so that the gripping member 141 of the handle runs along the top edge of the front face in the locked position, but it is understood that the same fixing device could be transposed through 900 so that the gripping member runs along a lateral edge of the front face. In this case, the operation of the handle to fix the apparatus would be from left to right or conversely. Similarly, the fixing device may be arranged so that, in the locked position, the gripping member of the handle runs along the bottom edge of the front face and in this case, the operation of the handle to fix the apparatus in the rack is carried out from top to bottom.

In the example of FIG. 1, the first fixing element 13 is formed by a hook supported by one end of the handle body 142. The other end of the handle body, opposite the pivot 143, is connected to the gripping member 141. The second fixing element 22, secured to the rack 2, comprises in this example a projecting pin 221 whose form complements that of the hook 13 making it possible to fasten them together when the apparatus is inserted into the rack to be fixed. In this exemplary embodiment, the projecting pin 221 may be moved along a slide 222 formed in the rack longitudinally (that is to say in the direction of the connector retention forces); it is associated with a calibrated spring 223 so that the operation of the handle 13 causes the spring to be tensioned, making it possible to keep the connectors in contact with a sufficient force to contain the relative movements due to the vibrations between the apparatus and the rack. This involves overcoming the friction forces between the male and female contacts of the connector when the apparatus is inserted or extracted.

Advantageously, the apparatus 1 is fixed to the rack 2 via two opposite sides 12, 12a, as is the case in the example of FIG. 1. There are then three fixing points, the connector and the sides 12 and 12a which block the three directions of movement x, y, z. For this, the fixing device comprises elements arranged symmetrically either side of the apparatus. Thus it comprises first fixing elements on two opposite sides of the apparatus, these first fixing elements being moved by the operation of two handles 14, 14a in order to interact with second fixing elements secured to the rack, and two substantially identical locking mechanisms 15, 15a for each of the handles. In the example of FIG. 1, the gripping members 141, 141a of the two handles meet to form a central bar 145 allowing the simultaneous operation of the two handles.

Figure 2:
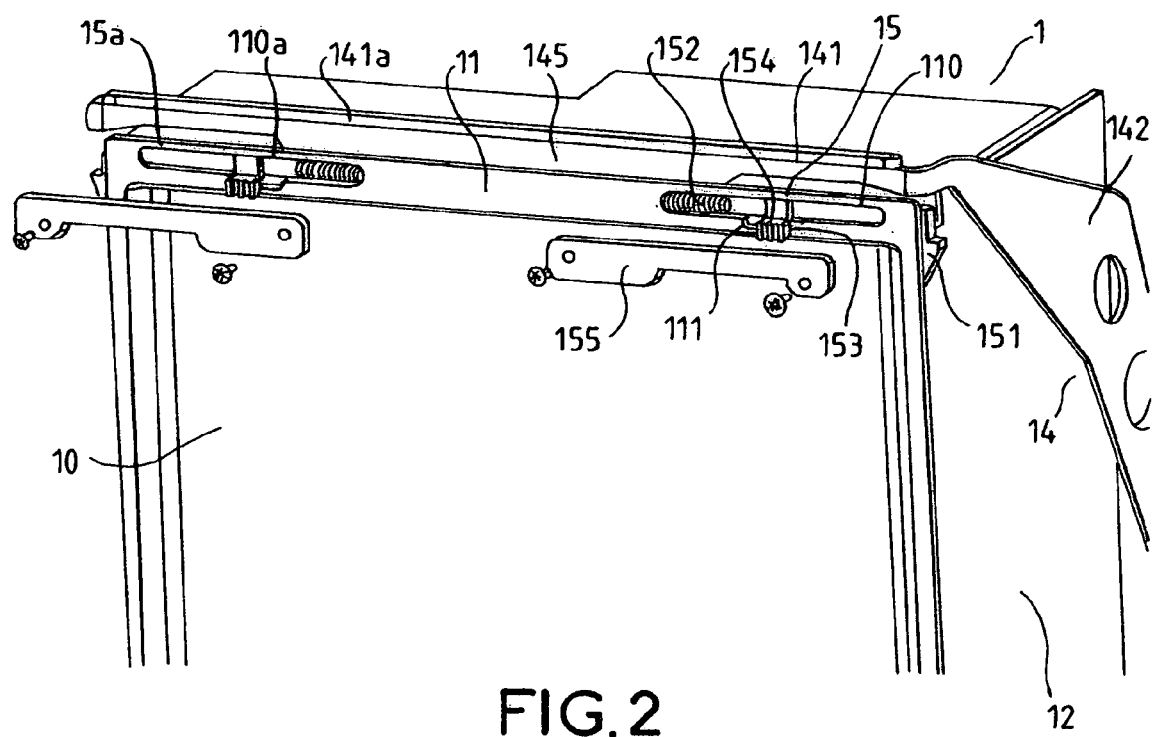
FIG. 2, a view of the locking mechanism according to an exemplary embodiment of the fixing device according to the invention, FIGS. 3A and 3B, the views of the locking mechanism described in FIG. 2 in two positions, respectively not locked and locked, FIGS. 4A and 4B, diagrams showing two variant embodiments of the locking mechanism described in FIG. 2.

There will now be described in greater detail an exemplary embodiment of the mechanism for locking the device according to the invention, represented in FIG. 2. In this figure, the rack is not shown.

In this exemplary embodiment, the locking mechanism comprises the sliding hook 151 designed to serve as an abutment for the handle body 142 in the locked position and a compression spring 152 associated with an abutment 153 used to keep the hook in the abutment position. The sliding hook and the compression spring are advantageously integrated into a housing 110 of the frame of the front face of the apparatus, thus making it possible to dispense with projecting parts on the front face and also making it possible to position the handle in locked position along the frame so that it does not reduce the effective zone on the front face; there is therefore no reduction of the angle of view. More generally, the housing of the locking mechanism may be formed in a rim which runs along a side of the front face. The locking mechanism also comprises a pushbutton 154 secured to the hook and situated on the front face of the apparatus allowing the user to retract the sliding hook to unlock the handle. In this example, the pushbutton may be moved in a housing 111 of the frame 11 which extends parallel to the housing 110 and one edge whereof forms the abutment 153 against which the pushbutton is immobilized, making it possible to stop the travel of the hook 151 in its abutment position for the handle body. A closure plate 155 is screwed in order to close the housing 110, thus providing the retention of the hook 151 and of the compression spring 152 and the guidance of the pushbutton 154.

Naturally, in the case in which the apparatus is fixed in the rack by two opposite sides, it is appropriate to ensure that the locking mechanisms 15, 15*a* act fully simultaneously if the two handles are actuated in one and the same movement. The symmetry of the mechanisms 15 and 15*a* advantageously makes it possible to guarantee a translation strictly parallel to the axis of the connector contacts, thus preventing any possible jamming of the apparatus on the connector and/or the rack, and a damaging of the contacts in the case of a single contact point.

Figure 3A:
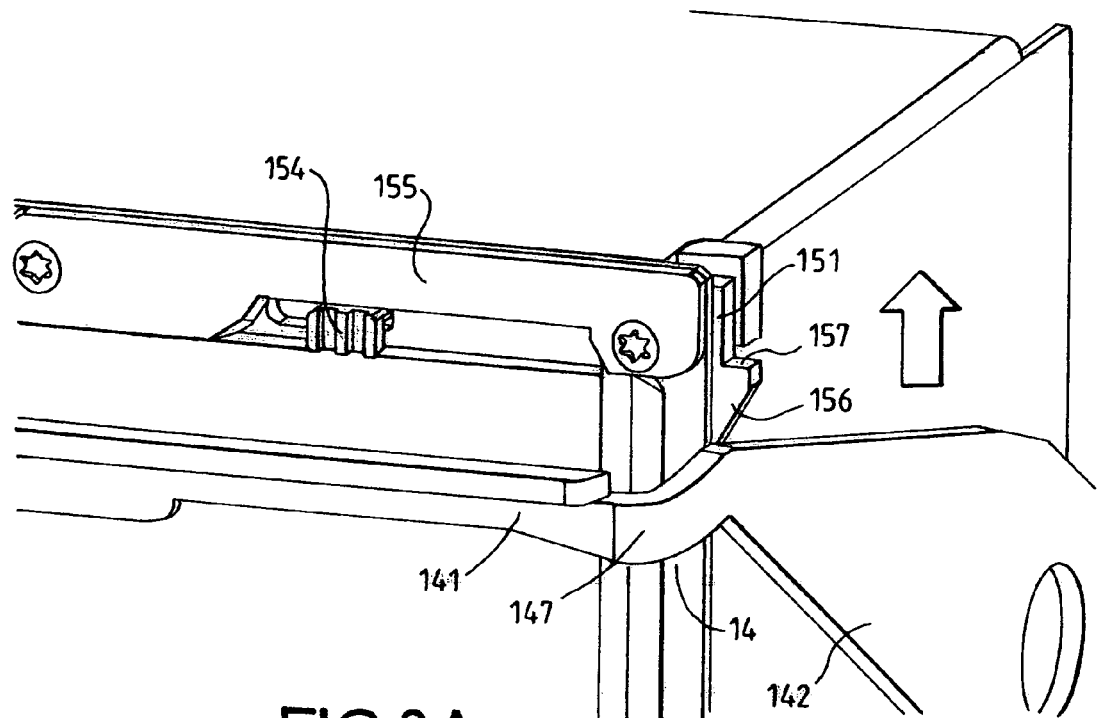
Figure 3B:
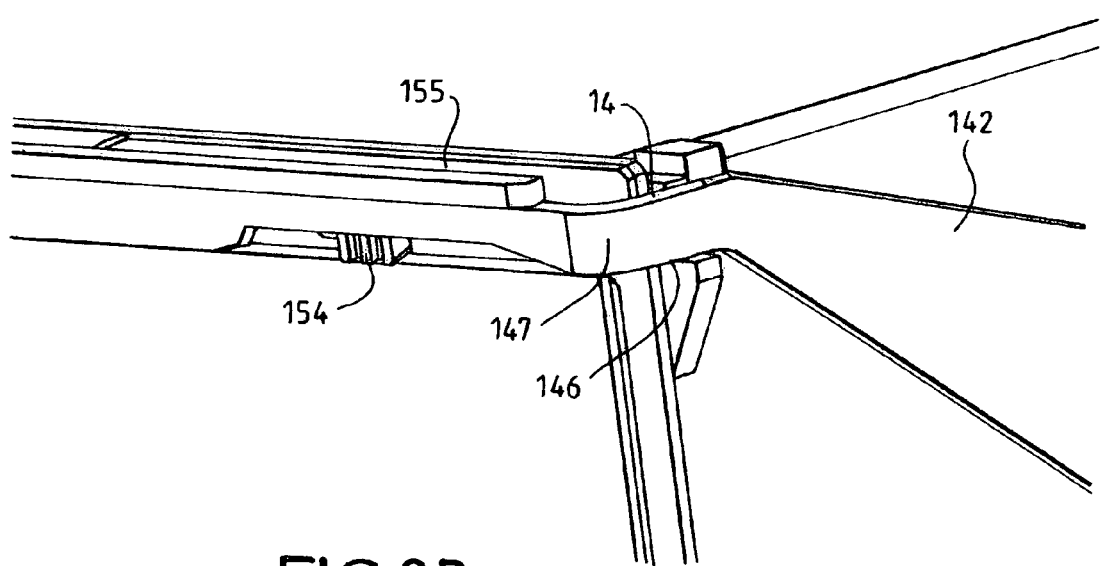

FIGS. 3A and 3B permit a clearer understanding of the mechanism for locking and unlocking the handle in the fixing device according to the invention. The mechanism represented is that of FIG. 2, in which the closure plate 155 is in place, thereby hiding the compression spring and the internal portion of the sliding hook 151. FIG. 3A represents the locking phase. In this example, the locking is carried out by an operation of the handle from bottom to top, as is symbolized by the arrow. The user pivots the handle 14 from bottom to top. The handle body 142 comes into contact with the outer portion of the hook 151. Advantageously, a slope 156 is made on the outer portion of the hook 151 allowing the handle to retract the hook and thus make its passage free. After the passage of the handle, the compression spring (not visible in FIG. 3A) repositions the hook in the out position (the travel of the hook being limited by the abutment of the pushbutton 154) thus acting as an obstacle to the return of the handle, which is in the locked position.

FIG. 3B thus represents the handle in its locked position. Advantageously, the hook 151 has a bearing plane 157 which interacts with a bearing plane 146 of the handle body to serve as an abutment. According to a preferential variant, the bearing plane 146 of the handle body extends longitudinally (that is to say from the front to the rear of the apparatus), thus making it possible to accept the defects of positioning of the locking mechanism relative to the plane which contains the front face of the apparatus. In the example of FIGS. 3A and 3B, the handle body 142 thus has a crank 147 on its end connected to the gripping member 141, making it possible to provide a bearing plane 146 whose longitudinal dimension is greater than that of the bearing plane 157 of the hook.

Figure 4A:
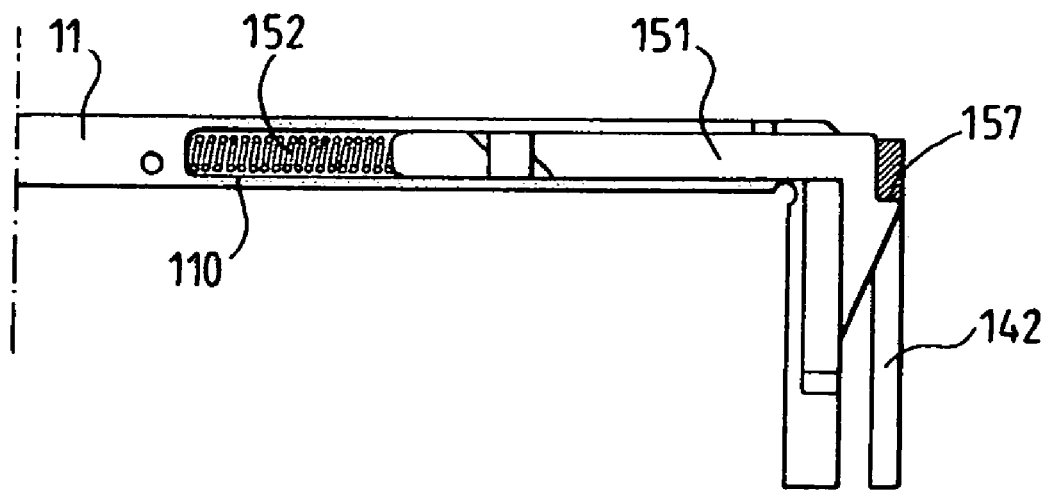
Figure 4B:
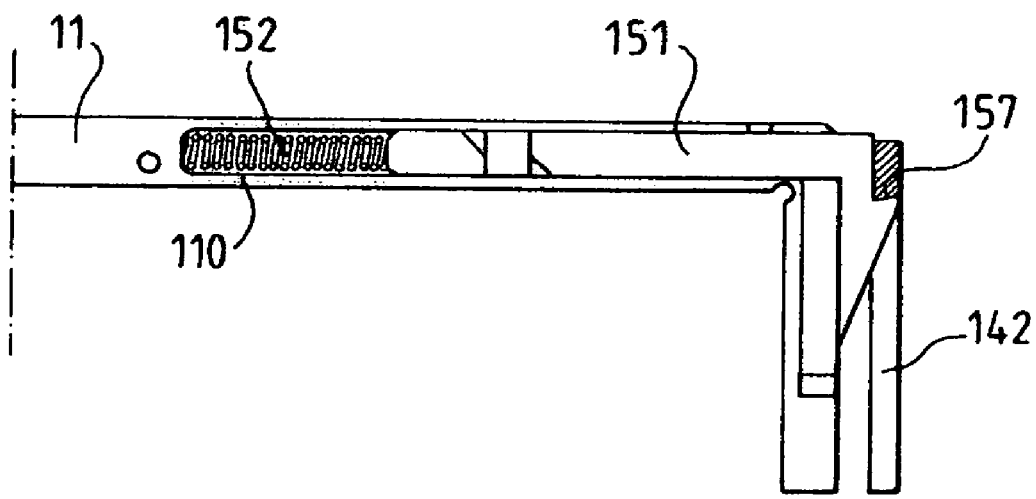

The bearing planes may be flat, that is to say in a plane parallel to the sliding axis of the hook, providing an unequivocal abutment of the handle body on the hook. According to a variant, the bearing planes may be beveled, which provides an additional security element in a severely vibrating environment. These two embodiments are schematized in FIGS. 4A and 4B which represent the locking mechanism (without its closure plate), seen from the front. FIG. 4A shows the hook 151 with a flat bearing plane 157 interacting with the bearing plane of the handle body 142. In FIG. 4B, the bearing planes are shown beveled.

To unlock the handle when it is in the locked position as shown in FIG. 3B, the user slightly raises the handle to disengage the hook 151 and acts on the pushbutton 154 so as to oppose the force of the compression spring to retract the sliding hook inward from its housing in the frame of the front face, thus releasing the handle which can be lowered.

It will be readily seen by one of ordinary skill in the art that the present invention fulfills all of the objects set forth above. After reading the foregoing specification, one of ordinary skill will be able to affect various changes, substitutions of equivalents and various other aspects of the invention as broadly disclosed herein. It is therefore intended that the protection granted hereon be limited only by the definition contained in the appended claims and equivalents thereof.

The invention claimed is:

1. A device for lock-fixing an apparatus comprising a front face, and at least two lateral sides designed to be mounted in a rack comprising side walls along which the lateral sides of the apparatus are inserted, said device comprising:
   first and second fixing elements respectively, securable to the two lateral sides of the apparatus and to the side walls of the rack, the first element being moved by operating a handle in order to interact with the second fixing element to fix the apparatus in the rack,
   a mechanism for locking said handle,
   the handle having a gripping member connected to a handle body situated on a lateral side of the apparatus, wherein;
   the locking mechanism comprises a sliding hook situated on one of the lateral sides close to an edge of the front face, a compression spring associated with an abutment used to hold the hook in an abutment position for positioning the handle in a locked position, and a pushbutton secured to the hook and situated on the front face of apparatus allowing a user to retract the sliding hook to unlock the handle, wherein in the locking phase,
   the handle being operated by the user in a rotary movement to fix the apparatus, the handle body moves along the lateral side comprising the hook, retracting said hook, thus freeing said handle to pass,
   after the passage of the handle, the compression spring repositions the hook in the abutment position in order to return the handle to the locked position.

2. The fixing device as claimed in claim 1, wherein the hook has a bearing plane interacting with a bearing plane of the handle body to serve as an abutment.

3. The fixing device as claimed in claim 2, wherein said bearing planes are in a plane parallel to the sliding axis of the hook.

4. The fixing device as claimed in claim 3, wherein the bearing plane of the handle body extends longitudinally, its longitudinal dimension being greater than that of the bearing plane of the hook.

5. The fixing device as claimed in claim 2 wherein the bearing plane of the handle body extends longitudinally, its longitudinal dimension being greater than that of the bearing plane of the hook.

6. The fixing device as claimed in claim 1, wherein the apparatus has a front face with a rim arranged on at least one of its sides, the sliding hook and the compression spring are integrated into a housing formed in said edge.

7. The fixing device as claimed in claim 6, wherein the apparatus having a front face rimmed by a frame, said rim forms one side of the frame.

8. The fixing device as claimed in claim 7 wherein a slope is made on the sliding hook allowing said hook to be retracted during locking of the handle.

9. The fixing device as claimed in claim 6, wherein the bearing plane of the handle body extends longitudinally, its longitudinal dimension being greater than that of the bearing plane of the hook.

10. The fixing device as claimed in claim 1, wherein the pushbutton may be moved in a housing one edge of which forms said abutment for the sliding hook.

11. The device as claimed in claim 10 wherein the locking mechanism comprises a plate for closing said housing.

12. The fixing device as claimed in claim 1, wherein the handle body is secured to the side of the apparatus via a rotating pivot.

13. The fixing device as claimed in claim 12, wherein the first fixing element is supported by one end of the handle body, opposite relative to said pivot of the end to which the gripping member is connected.

14. The fixing device as claimed in claim 13, wherein the first fixing element and the second fixing element, secured to the rack, have complementary shapes making it possible to fasten them to one another when the apparatus is pushed into the rack to be fixed.

15. The fixing device as claimed in claim 14, wherein the first element is formed of a hook and the second element is formed of a projecting pin that can be moved along a slide formed in the rack and is associated with a spring calibrated so that the operation of the handle causes said calibrated spring to be placed in tension.

16. The fixing device according to claim 1, further comprising first fixing elements on two opposite sides of the apparatus, these first fixing elements being moved by the operation of two handles in order to interact with second fixing elements secured to the rack, and in that it comprises two locking mechanisms substantially identical for each of said handles.

17. The fixing device according to claim 16, wherein the gripping members of the two handles join together to form a central bar allowing the two handles to be operated simultaneously.

18. The fixing device as claimed in claim 1, in combination with a rack, wherein the rack includes an area of reduced thickness on each of its side walls thereby allowing said handle body to be housed.

* * * * *

UNITED STATES PATENT AND TRADEMARK OFFICE
CERTIFICATE OF CORRECTION

| | |
|---|---|
| PATENT NO. | : 7,347,514 B2 |
| APPLICATION NO. | : 10/532065 |
| DATED | : March 25, 2008 |
| INVENTOR(S) | : Daniel Laret et al. |

Page 1 of 1

It is certified that error appears in the above-identified patent and that said Letters Patent is hereby corrected as shown below:

On the Title page, the Assignee Information should read as follows:

Item (73) Assignee: THALES (FR) and AIRBUS FRANCE (FR)

Signed and Sealed this

Thirtieth Day of December, 2008

JON W. DUDAS
*Director of the United States Patent and Trademark Office*